(12) United States Patent
Campini et al.

(10) Patent No.: US 7,255,578 B2
(45) Date of Patent: Aug. 14, 2007

(54) TWO-DIMENSIONAL ADJUSTABLE EDGE CONNECTOR ADAPTOR

(75) Inventors: Edoardo Campini, Mesa, AZ (US); William Handley, Chandler, AZ (US); Mark D. Summers, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 208 days.

(21) Appl. No.: 11/097,871

(22) Filed: Mar. 31, 2005

(65) Prior Publication Data

US 2006/0221559 A1 Oct. 5, 2006

(51) Int. Cl.
*H01R 12/00* (2006.01)

(52) U.S. Cl. ............................................ 439/79

(58) Field of Classification Search ............... 439/79, 439/59, 86, 637, 931, 81
See application file for complete search history.

(56) References Cited

U.S. PATENT DOCUMENTS 4,820,170 A    4/1989  Redmond et al.
4,840,570 A *  6/1989  Mann et al. ................. 439/74
4,869,842 A *  9/1989  Denis et al. ................. 510/365
5,441,419 A *  8/1995  Takazawa et al. ........... 439/86

* cited by examiner

*Primary Examiner*—Phuong Dinh
(74) *Attorney, Agent, or Firm*—Blakely, Sokoloff, Taylor & Zafman LLP

(57) ABSTRACT

A two-dimensional adjustable edge connector adaptor to support high bandwidth signal paths. The edge connector adapter includes a housing having a cavity formed in one side and an edge connector extending outward from an opposing side. The edge connector includes contact members that are configured to function as conventional edge connector contacts on one end, while the opposing end includes a leg that is in contact with first side of an elastomer connector disposed in the cavity. The elastomer connector facilitates electrical coupling between each contact member and a corresponding board contact on a board having a connector edge that is inserted into the cavity, wherein each board contact includes a leg that is in contact with a second side of the elastomer connector. The adjustable edge connector adaptor enables the board to be positioned in both the horizontal and vertical directions relative to the edge connector.

21 Claims, 12 Drawing Sheets

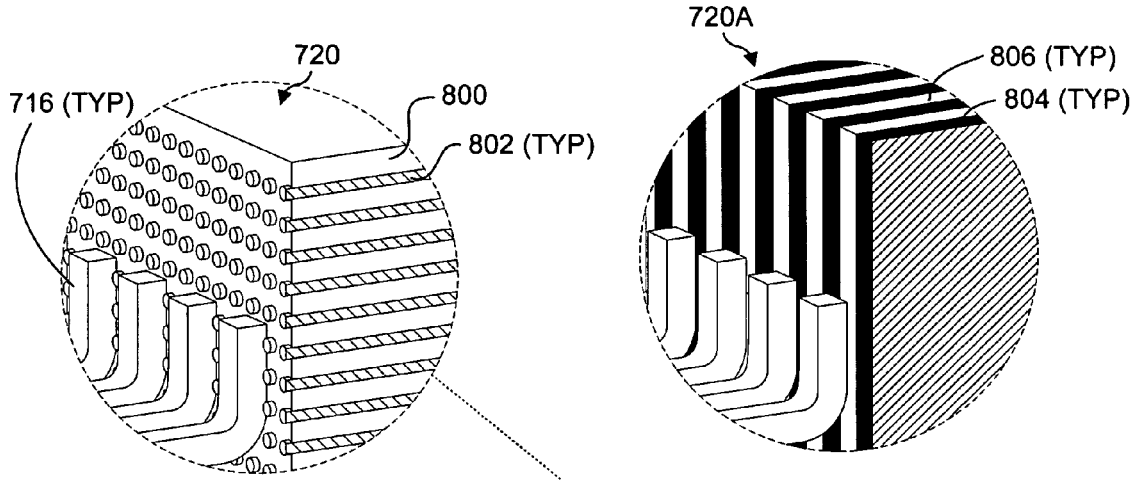
*Fig. 8a*
*Fig. 8b*
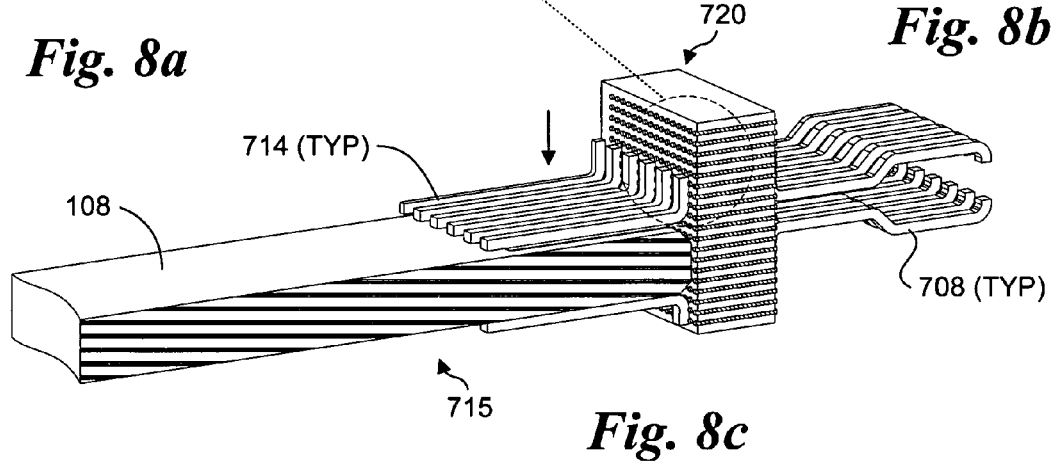
*Fig. 8c*
*Fig. 8d*

TWO-DIMENSIONAL ADJUSTABLE EDGE CONNECTOR ADAPTOR

FIELD OF THE INVENTION

The field of invention relates generally to computer and telecommunications equipment, and, more specifically but not exclusively relates to a card edge adaptor that enables the height and position of a board or card to be adjusted while still providing suitable connectivity to support high-bandwidth applications such as that required for next-generation modular computer and telecommunication equipment.

BACKGROUND INFORMATION

The Advanced Telecom Computing Architecture (ATCA) (also referred to as AdvancedTCA) standard defines an open switch fabric based platform delivering an industry standard high performance, fault tolerant, and scalable solution for next generation telecommunications and data center equipment. The development of the ATCA standard is being carried out within the PCI Industrial Computer Manufacturers Group (PICMG). The ATCA Base Specification, PIGMG 3.0 Revision 1.0, published Dec. 30, 2002 (hereinafter referred to as "the ATCA specification") defines the physical and electrical characteristics of an off-the-shelf, modular chassis based on switch fabric connections between hot-swappable blades. The Advanced TCA base specification supports multiple fabric connections, and multi-protocol support (i.e., Ethernet, Fibre Channel, InfiniBand, StarFabric, PCI Express, and RapidIO) including the Advanced Switching (AS) technology.

The ATCA specification defines the frame (rack) and shelf (chassis) form factors, core backplane fabric connectivity, power, cooling, management interfaces, and the electromechanical specification of the ATCA-compliant boards. The electromechanical specification is based on the existing IEC60297 EuroCard form factor, and enables equipment from different vendors to be incorporated in a modular fashion and be guaranteed to operate. The ATCA specification also defines a power budget of 200 Watts (W) per board, enabling high performance servers with multi-processor architectures and multi gigabytes of on-board memory.

Recently, the modularity of the ATCA architecture has been extended to another level, wherein hot-swappable, field-replaceable mezzanine cards (or modules) may be hosted by an ATCA carrier board. Standards for the mezzanine cards/modules and related interfaces are defined by the Advanced Mezzanine Card (AdvancedMC) (also called AMC) specification, PIGMG AMC.0, Revision 1.0, published Jan. 3, 2005 (hereinafter referred to as the AMC.0 specification). Optimized for packet-based, high-availability telecom systems, AdvancedMC modules can be attached to a variety of ATCA and proprietary carrier blades. AdvancedMC modules communicate with the carrier board via a packet-based serial interface, which features up to 21 lanes of high-speed input/output (I/O) at 12.5 Gbit/sec each. The specification defines standard mezzanine module configuration for both full-height and half-height AdvancedMC modules, as well as modules employing single-width and double-width cards. AdvancedMC is slated to support a variety of protocols, including Ethernet, PCI Express, and Serial Rapid I/O. AdvancedMC also features integrated $I^2C$- and Ethernet-based system management. AdvancedMC modules may also be employed for non-ATCA systems.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 7b shows a cut-away view of the edge connector adaptor of FIG. 7a;

FIG. 8a shows a detail view of the interface between board contacts and an elastomer connector comprising an elastomer with conductive elements configured in an array, which is employed by some embodiments of the invention;

FIG. 8b shows a detail view of the interface between board contacts and an elastomer connector comprising alternate conductive and non-conductive elastomer layers, which is employed by some embodiments of the invention;

FIG. 8c shows in isometric view illustrating selective elements corresponding to a downward board assembly position;

FIG. 8d shows in isometric view illustrating selective elements corresponding to an upward board assembly position;

FIG. 9b shows a partial cross section view illustrating selective elements corresponding to the upward board assembly position of FIG. 8c when using the elastomer connector of FIG. 8a;

FIG. 9c shows a partial cross section view illustrating selective elements corresponding to the downward board assembly position of FIG. 8d when using the elastomer connector of FIG. 8a;

DETAILED DESCRIPTION

Embodiments of an edge connector adapter suitable for use in high-bandwidth applications are described herein. In the following description, numerous specific details are set forth, such as implementations for Advanced Mezzanine Card (AdvancedMC) cards and Advanced Telecom Computing Architecture (ATCA) carrier boards and chassis, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
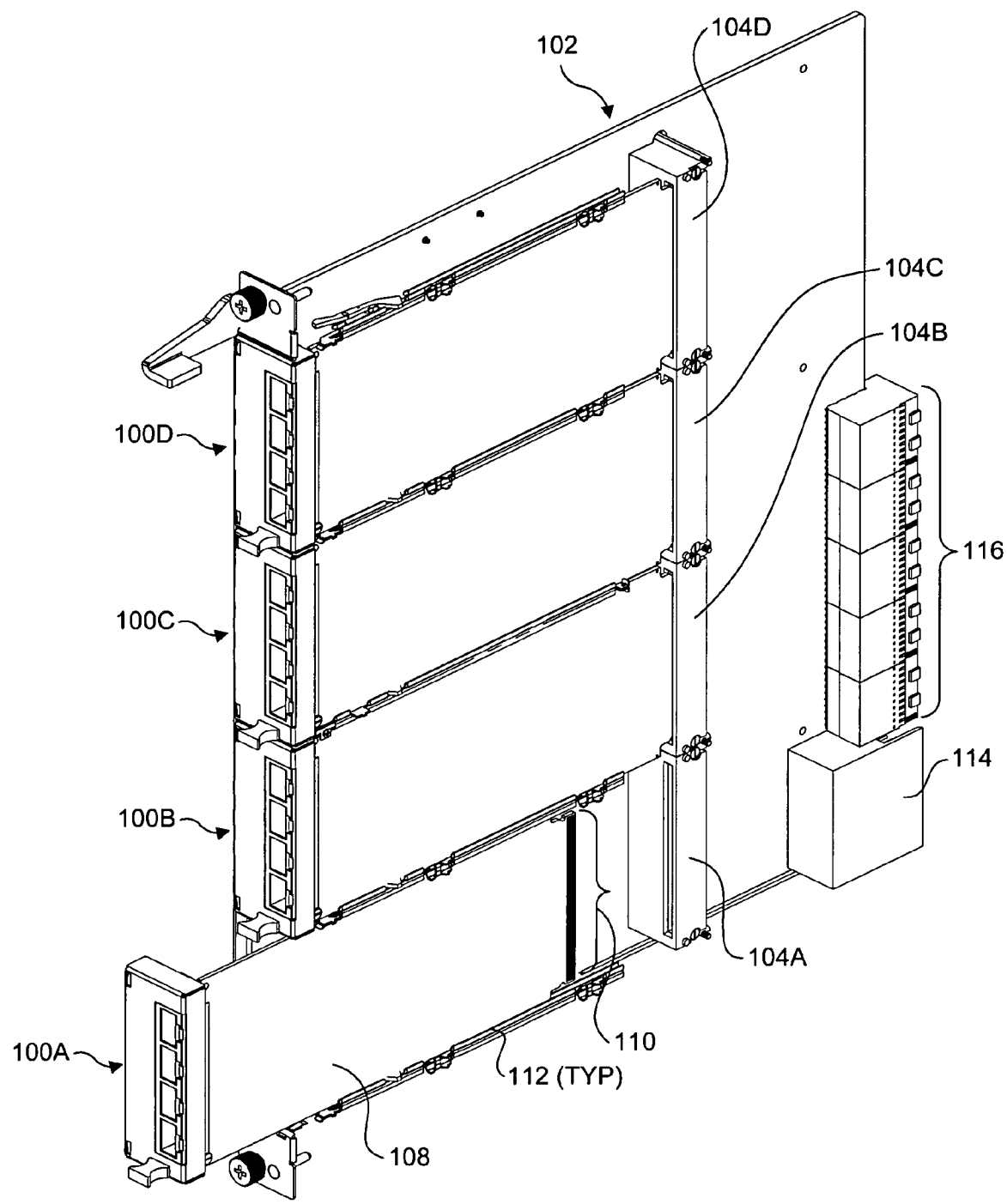
FIG. 1a is an isometric view of an Advanced Telecommunication Architecture (ATCA) carrier board to which four full-height single-width Advance Mezzanine Card (AdvancedMC) modules are coupled.

FIG. 1a shows an exemplary AdvancedMC module implementation wherein four single-width full-height AdvancedMC modules 100A, 100B, 100C, and 100D are installed on an ATCA carrier board 102. In general, ATCA carrier boards may have various configurations, depending on the number and type of AdvancedMC modules the carrier board is designed to host. For example, ATCA carrier board 102 includes four single-width full-height AdvancedMC connectors 104A, 104B, 104C, and 104D.

Figure 1B:
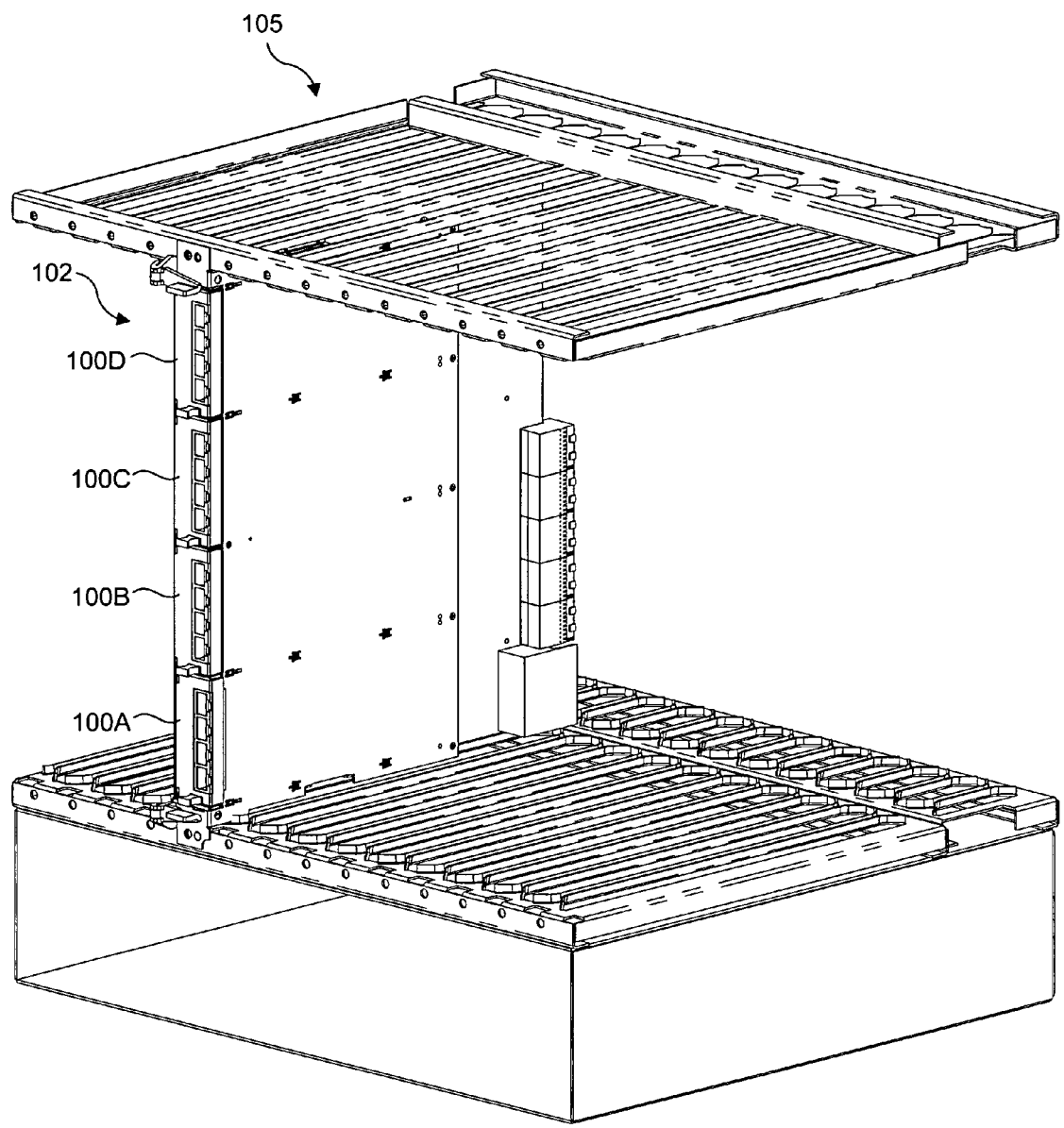
FIG. 1b shows an exemplary ATCA carrier board including four AdvancedMC modules installed in an ATCA chassis.

ATCA carrier boards (also referred to as simply ATCA boards), are configured to be installed in an ATCA chassis. For example, FIG. 1b shows an ATCA carrier board 102 installed in an ATCA chassis 105. For the purpose of simplicity and clarity, the backplane board and connector components for the ATCA chassis, as well as other components including cooling fans and ducting are not shown in FIG. 1b.

Figure 5A:
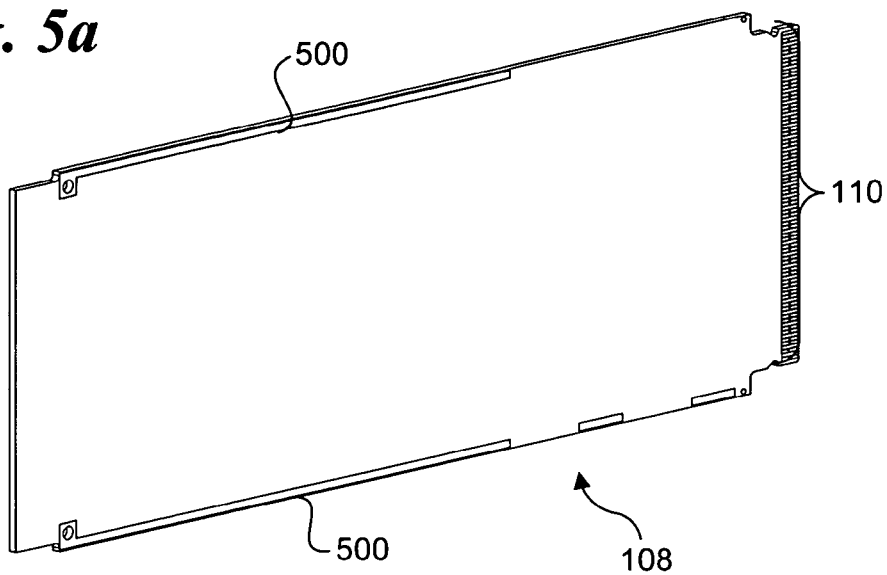
FIG. 5a is an isometric view of a single-width printed circuit board (PCB) card used in a half-height or full-height single-width AdvancedMC module.

Under the AMC.0 specification, full-height AdvancedMC connectors are referred to as Style "B" (basic) or "B+" (extended) connectors. The term "basic" is associated with AdvancedMC connectors that are equipped with contacts on only one side of the connector slot. The term "+" identifies the connector as an extended connector having contacts on both sides of the connector slot. A single-width AdvancedMC module includes a single-width AdvancedMC card 108 having a single-width edge connector 110, further details of which are shown in FIG. 5a. As with its mating connector, a single-width edge connector may include contacts on a single side (basic) or both sides (extended).

The horizontal (or longitudinal) card edges of an AdvancedMC card are guided via a set of guide rails 112 disposed on opposing sides of the card. An ATCA carrier board also includes a power connector 114 via which power is provided to the carrier board from an ATCA chassis backplane, and various input/output (I/O) connectors 116 via which signals are routed to the backplane, and hence to other ATCA boards and/or AdvancedMC modules (mounted to other ATCA carrier boards) that are similarly coupled to the ATCA backplane.

Generally, the circuit components on an AdvancedMC module PCB card will be disposed on the side of the card facing the top or front side of the corresponding carrier board. This protects the circuitry, among other reasons for the configuration. To add further protection, an ATCA carrier board assembly will typically include a cover plate that is disposed over the backside of the AdvancedMC module PCB cards; the ATCA carrier board assemblies of FIGS. 1, 2, and 3, do not show the cover plate for clarity in illustrating how the PCB card edge connectors are mated to corresponding AdvancedMC connectors under a conventional implementation.

Figure 2:
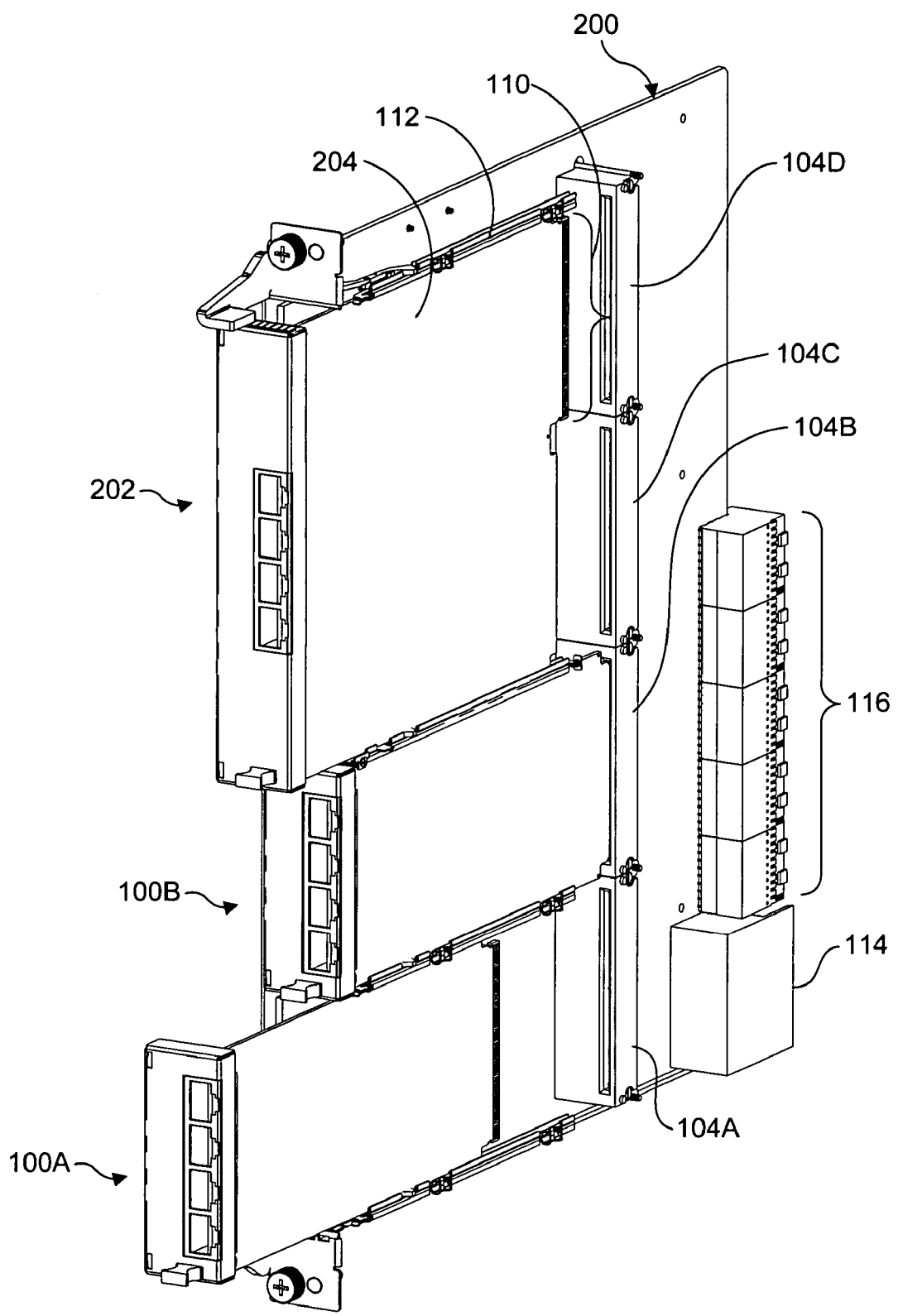
FIG. 2 is an isometric view of an ATCA carrier board to which to full-height single-width AdvancedMC modules and one conventional full-height double-width AdvancedMC module are coupled.
Figure 5B:
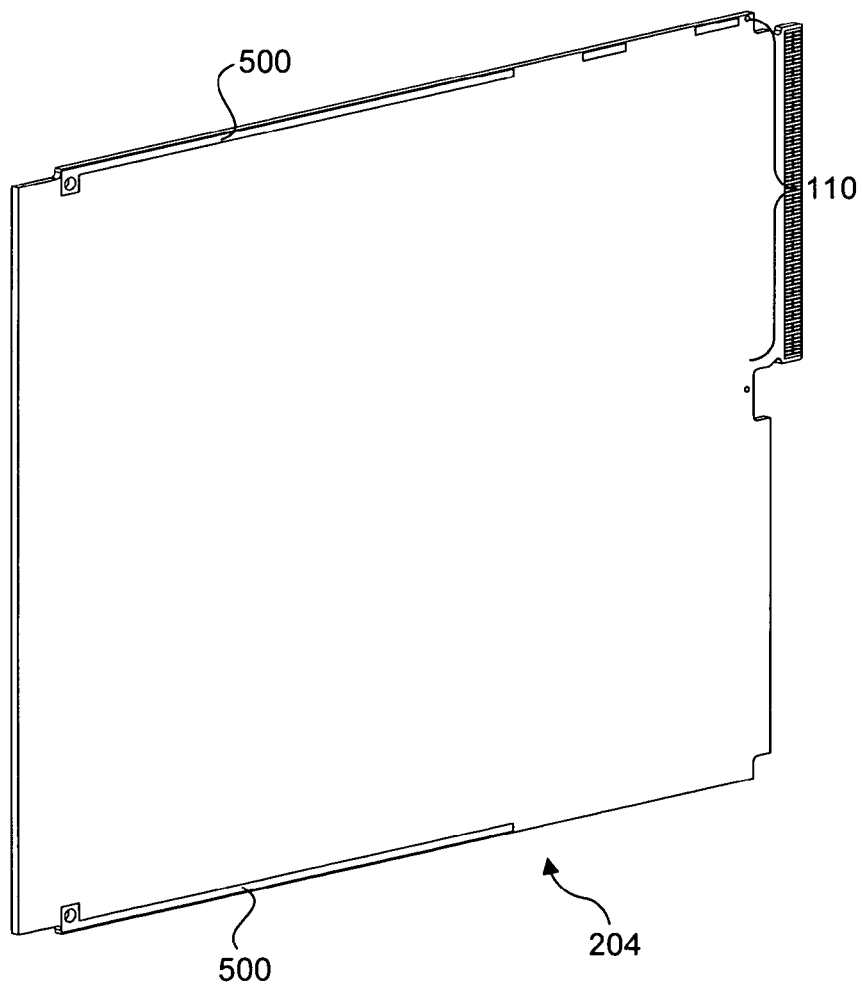
FIG. 5b is an isometric view of a double-width PCB card having a single edge connector used in a half-height or full-height double-width AdvancedMC module.

An ATCA carrier board 200 that supports a combination of single-width and double-width full-height AdvancedMC modules is shown in FIG. 2. As with the configuration of FIG. 1, ATCA carrier board 200 includes four full-height AdvancedMC connectors 104A, 104B, 104C, and 104D. Guide rails 112 are configured for receiving a pair of single-width full-height AdvancedMC modules 100A and 100B, as well as a double-width full-height AdvancedMC module 202. A double-width full-height module includes a double-width PCB card 204 including a single edge connector 110, as shown in FIG. 5b. Thus, when a conventional double-width full-height AdvancedMC module is installed, it is coupled to a single single-width full-height AdvancedMC connector 104.

Figure 3:
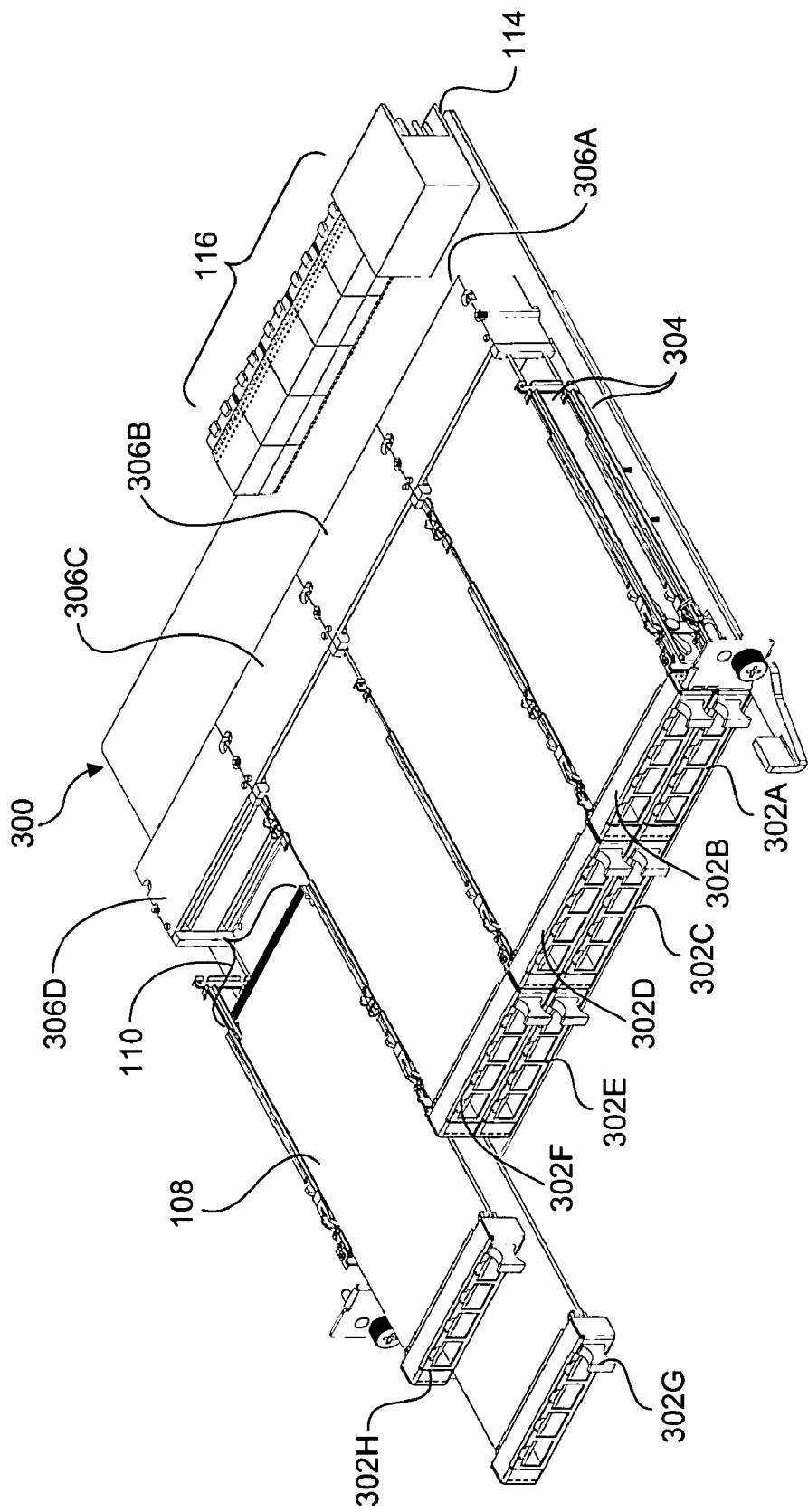
FIG. 3 is an isometric view of an ATCA carrier board to which to eight half-height single-width AdvancedMC modules are coupled.

In addition to full-height AdvancedMC modules, the AMC.0 specification defines use of single- and double-width half-height modules that may be stacked in a pair-wise manner that supports up to eight single-width, half-height modules. For example, such a configuration is shown in FIG. 3, which includes an ATCA carrier board 300 configured to support eight single-width single height AdvancedMC modules 302A, 302B, 302C, 302D, 302E, 302F, 302G, 302H. The configuration of a single-width board is the same whether it is used in a half-height or full-height AdvancedMC module. In the case of half-height modules, sets of dual-height rails 304 are employed to guide the card edges of each module.

ATCA carrier board 300 includes four AdvancedMC connectors 306A, 306B, 306C, and 306D. Each AdvancedMC connector has one of two possible configurations, referred to as style "AB" (for single-sided connections), and style A+B+ (for double sided connections). The lower connector slot on a AdvancedMC connector is referred to as slot "A", while the upper connector slot is referred to as slot "B," hence the names "AB" and "A+B+."

Figure 4:
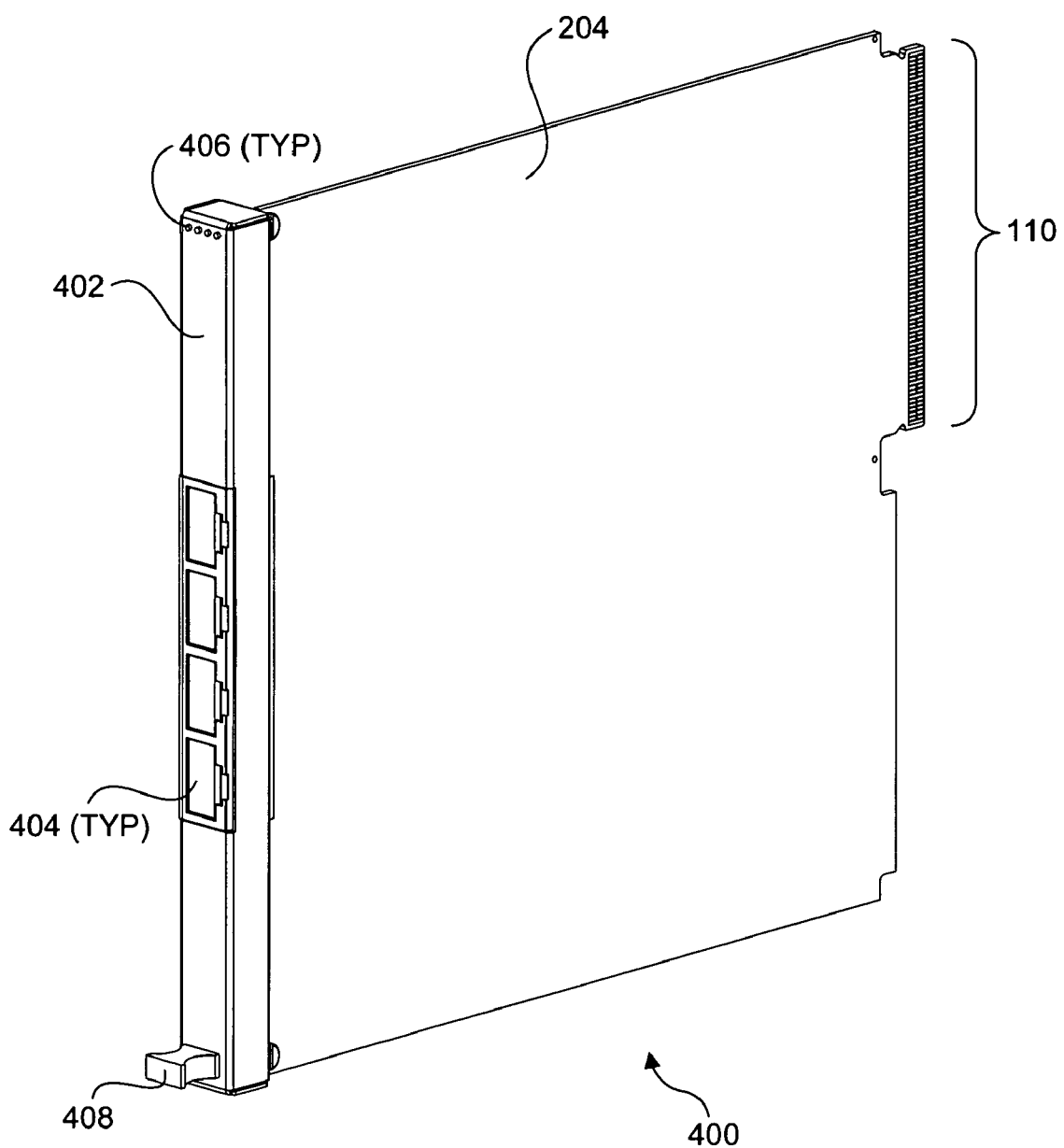
FIG. 4 is an isometric view of a half-height double-width AdvancedMC module.

An example of a conventional half-height double-width AdvancedMC module 400 is shown in FIG. 4. The module includes a double-width PCB board 204 with a single edge connector 110; as with single-width modules, the configuration of a double-width PCB card is the same whether it is used in a half-height or full-height AdvancedMC module. The module 400 further includes a half-height front panel 402 (also referred to as a "face plate") coupled to PCB card 204. The front panel may generally include provisions for various input/output (I/O) ports via which external devices may communicate with a module. For illustrative purposes, FIG. 4 shows four RJ-45 Ethernet jacks 404. Various other types of I/O ports may also be employed, including, but not limited to universal serial bus (USB) ports, serial ports, infared ports, and IEEE 1394 ports. (It is noted that mechanical interface for each port is typically coupled to the PCB card, with an appropriately-sized aperture defined in the front panel). A front panel may also include various indicators, such as light-emitting diodes (LEDs) 406, for example, as well as input switches (not shown). In addition, a front panel will typically include a handle or similar means for grasping a module when it is being installed or removed from a carrier board, such as depicted by a handle 408.

Further details of an AdvancedMC module single-width PCB card 108 are shown in FIG. 5a, while further details of an AdvancedMC module double-width PCB card 204 are shown in FIG. 5b. Each of PCB cards 108 and 204 include a pair of PCB electrostatic discharge strips 500 that are used to slidingly engage AdvancedMC guide rails 112 during insertion of the associated AdvancedMC module. In addition, each of single-width PCB card 108 and conventional double-width PCB card 204 include a respective edge connector 110 of identical configuration. The single-edge connector is configured to mate with a connector slot in an appropriately configured AdvancedMC connector, wherein the conductive traces at the edge of the PCB edge-connector (also referred to as contacts) act as male pins, which mate to a corresponding contacts (in the form of tiny balls that make contact to the traces on the AdvancedMC module edge connector) in the AdvancedMC connector slot. For example, a single-sided edge connector would require a B or AB style AdvancedMC connector. Similarly, a double-sided edge connector requires a B+ or A+B+ style AdvancedMC connector.

Figure 6:
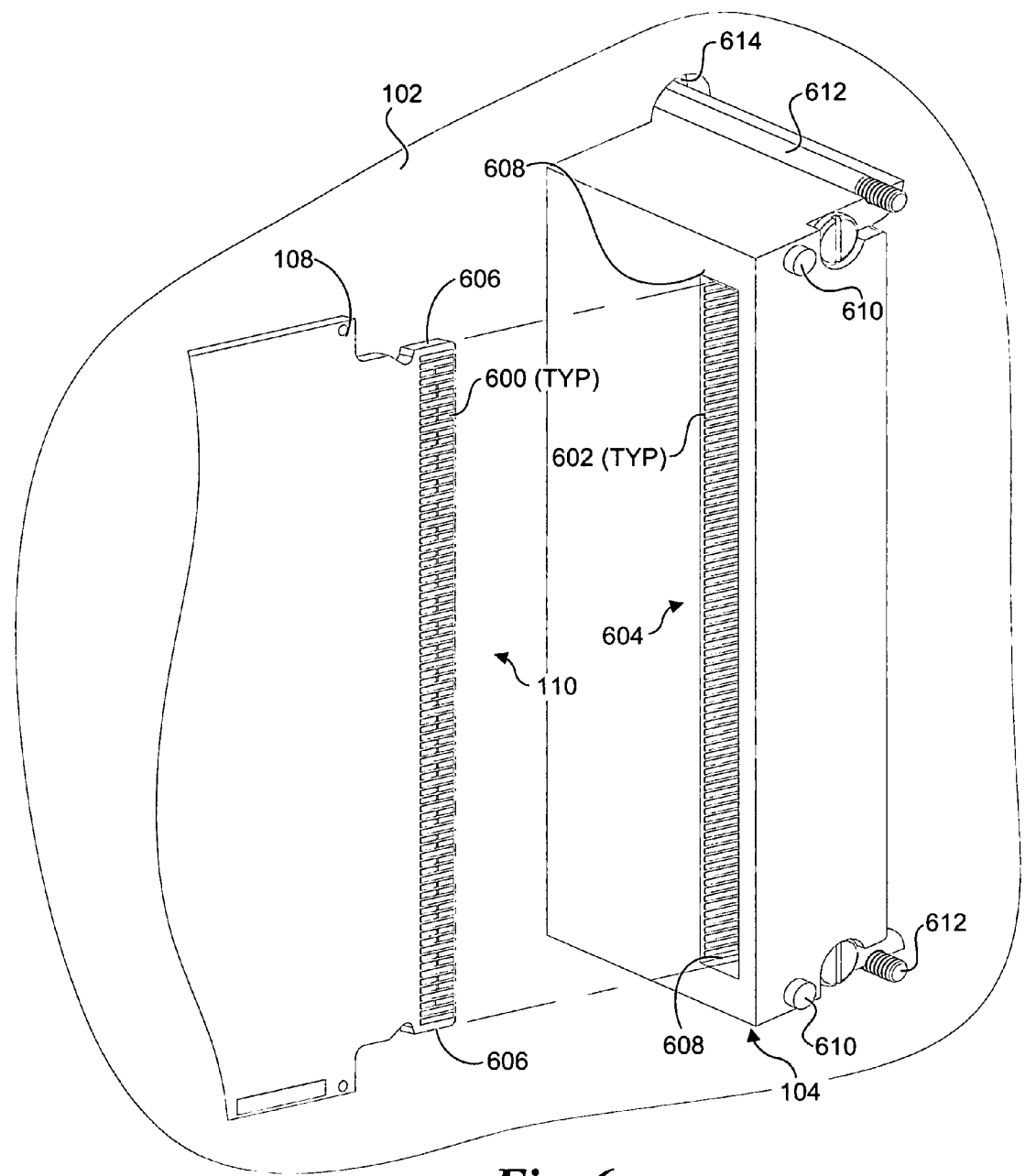
FIG. 6 is a detailed isometric view of the coupling and self-centering action between an edge connector and an AdvancedMC connector.

Details of an AdvancedMC module PCB board edge connector 110 and full-height AdvancedMC connector 104 are shown in FIG. 6. A single-sided edge connector includes 85 contacts 600, while a double-side edge connector includes 170 contacts 600 (85 on both sides). The pitch of the contacts is 0.75 millimeters mm. In order to accurately align the male edge connector contacts 600 with the corresponding female AdvancedMC connector contacts 602, a self-centering scheme is employed, such that the edge connector becomes centered within the AdvancedMC connector slot 604 upon insertion of an AdvancedMC module. This is accomplished via a sliding engagement between edges 606 of edge connector 110 with mating edges 608 formed on the inside of the connector slot 606 of full-height AdvancedMC connector 104. The tolerance between the mating parts is very tight to ensure high accuracy in the alignment of the mating electric contacts. Such high accuracy is required, in part, due to the high-frequency of the numerous I/O signals coupled via an AdvancedMC connector in view of the very small contact size and contact pitch.

Each of the various AdvancedMC connectors (e.g., B, AB, B+ and A+B+ style connectors) has a fixed, standardized configuration. This is typically advantageous (since it supports interchangeable parts supplied by different vendors), but leads to restrictions in terms of design flexibility. In one particular instance, the restriction relates to the height of components that may be employed on AdvancedMC module boards.

More specifically, the height of each connector slot in an AdvancedMC connector is offset from the base of the connector at a fixed, predetermined distance. As a result, the height (offset distance) of an AdvancedMC module board from an ATCA carrier board is likewise fixed. This provides a limit to the height of components that are mounted to the module boards.

Embodiments of the present invention address the foregoing limitations by providing an adjustable edge connector adaptor that enables the offset distance between an AdvancedMC module board and an ATCA carrier board to be adjusted relative to the AdvancedMC connector slot height, thus enabling components having greater heights to be employed on the module boards. At the same time, these embodiments support the use of both existing a future AdvancedMC module boards (that are compliant with the AMC.0 specification) and AdvancedMC connectors.

Details of an edge connector adaptor 700 illustrating aspects of various embodiments are shown in FIGS. 7a-b, 8a-c, 9a-c, 10a-b and 11a-b. The edge connector adaptor 700 facilitates an adjustable connection between an AdvancedMC module card 108 and an AdvancedMC connector 104, which is depicted as being mounted to a cut-away ATCA carrier board 102 in FIG. 7a for illustrative purposes.

Figure 7A:
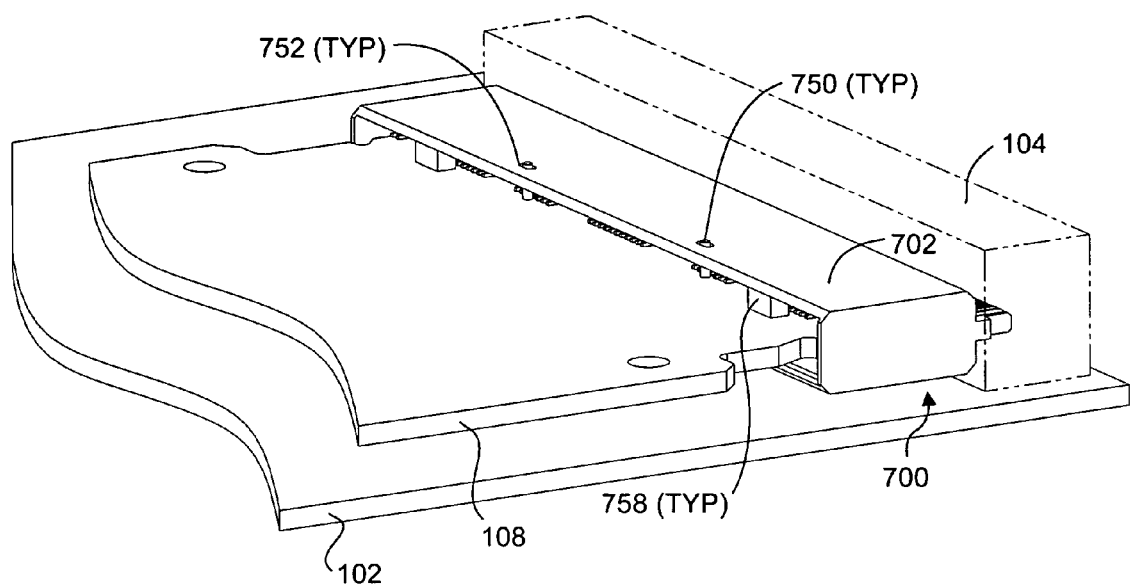
FIG. 7a shows an isometric view of an adjustable edge connector adaptor that facilitates adjustment between a board relative to an edge connector of the adaptor, according to one embodiment of the invention.
Figure 7B:
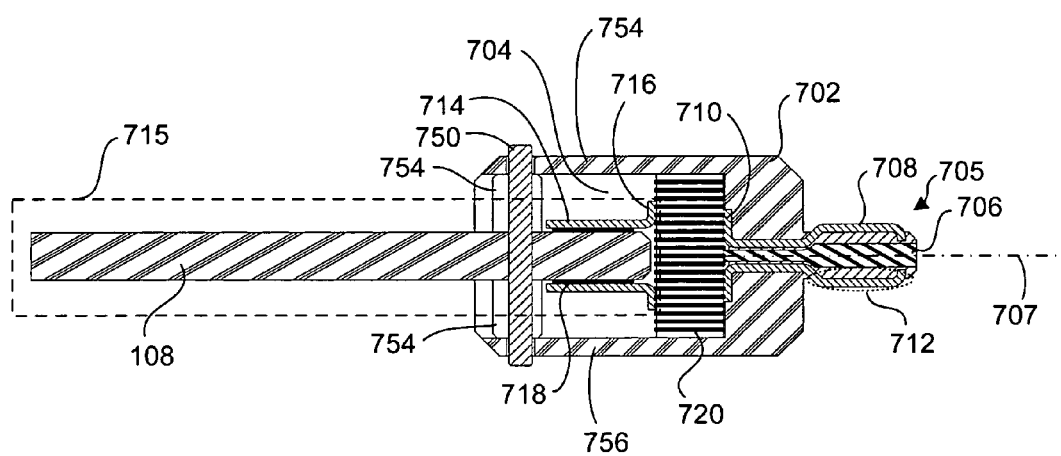

As shown in detail in the cross-section view of FIG. 7b, the adjustable edge connector adaptor 700 comprises a housing 702 having a cavity 704 formed in one side, and an edge connector 705 including a connector edge 706 extending outward from the opposing side of the housing and having a centerline 707. A plurality of contact members 708 are arrayed across the width of connector edge 706. Each contact member has a leg 710 formed in a first (inward) end and a raised portion 712 formed toward an opposing (outward) end, the latter forming the contacts for edge connector 705.

A plurality of board contacts 714 are coupled to AdvancedMC module card 108 to form a board assembly 715. Each board contact 714 includes a leg 716 that is substantially perpendicular to the longitudinal axes of the board contact. In one embodiment, the board contacts 714 are applied to respective edge connector contacts 718 of an existing Advanced MC module card during a post-manufacture (of the existing card) operation. In another embodiment, board contacts 714 are applied in conjunction with other board manufacture operations. In general, each contact is internally connected to a respective trace in the card printed circuit board (PCB). In one embodiment, conductive pads are formed on a surface of the PCB, and the board contacts are soldered to respective pads.

An elastomer connector 720 is disposed toward the center of housing 702. In general, an elastomer connector (also commonly referred to as zebra connectors or zebra strips) comprises an elastomer embedded with conductive elements. For illustrative purposes, the thickness of elastomer connector 720 is exaggerated. As shown in the detail isometric view of FIG. 8a, in one embodiment elastomer connector 720 comprises an elastomer 800 embedded with conductive fibers 802 that are arrayed in a square grid. In one embodiment, the conductive fibers 802 have a diameter of 30 micrometers (μm), and a grid spacing of 100 μm. Other diameters and grid spacing may also be used. In another embodiment shown in FIG. 8b, an elastomer connector 720A comprising alternating conductive layers 804 and non-conductive elastomer layers 806 is used.

In general, elastomer connectors of the types illustrated in FIGS. 8a and 8b are commercially available for purchase or may be manufactured to meet a particular configuration. Examples of companies that manufacture elastomer connectors include Fujipoly American Corporation, Carteret N.J.

(manufacture of Zebra® elastomer connectors), and Sharp Microelectronics Corporation.

Figure 9A:
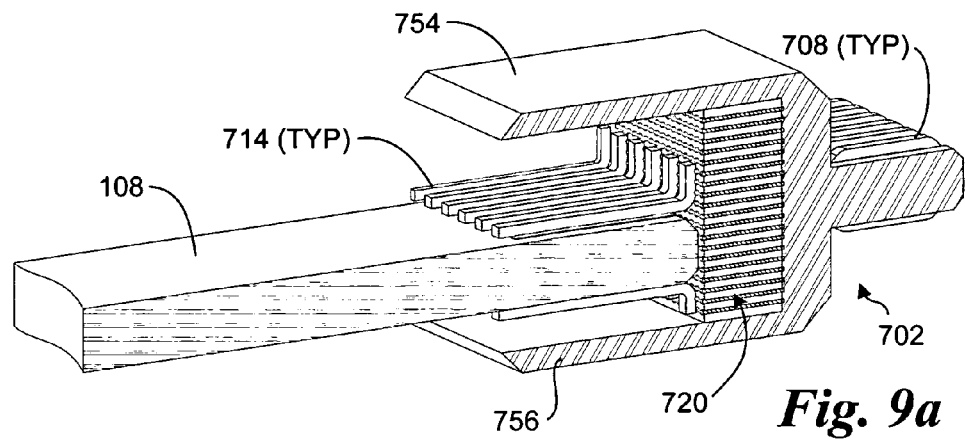
FIG. 9a shows a cross-sectional view detailing selective elements of the edge connector adaptor of FIGS. 7a and 7b.
Figure 9B:
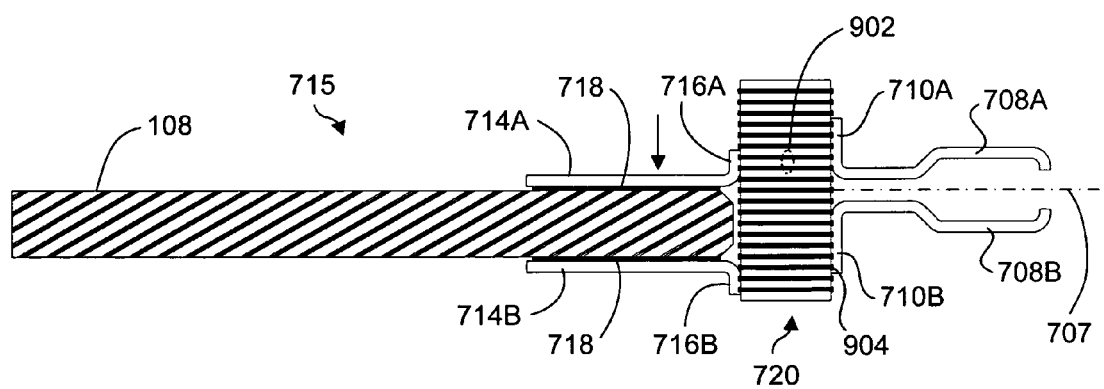

As shown in FIGS. 8c, 8d, 9b and 9c, the elastomer connector 720 enables the adjustable board-half of the connector assembly to move up and down while still providing connectivity to the fixed half of the connector assembly. Meanwhile, there is no cross-connectivity between adjacent board contacts 714 or contact members 708. For example, FIGS. 8c and 9b show a board assembly 715 including an AdvancedMC module card 108 having a downward displacement relative to a centerline 900 (FIG. 9b) of contact members 708 (which is illustrative of the centerline for edge connector 705). In the illustration depicted in FIG. 9b, connectivity between an upper board contact 714A and an upper contact member 708A is facilitated by conductive elements 902 in elastomer connector 720 which are in contact with the leg 716A of upper board contact 714A and the leg 710A of upper contact member 708A at opposing ends. Meanwhile, connectivity between a lower board contact 714B and a lower contact member 708B is facilitated by a conductive element 904 in elastomer connector 720, which is in contact with the leg 716B of lower board contact 714B and the leg 710B of lower contact member 708A. (It is noted that for illustrated purposes, the spacing and size of the conductive elements in the elastomer connectors 720 depicted herein are exaggerated for clarity. In actuality, the size and spacing of the conductive elements is much smaller than depicted.) Similar conductivity is provided for each pair of associated board contact 714 and contact member 708 for the other board contacts and contact members disposed across the width of AdvancedMC module card 108 and connector edge 706 (see FIG. 7b). Thus, in the downward position illustrated in FIGS. 8c and 9b, each contact member 708 is effectively coupled to a respective contract trace 718.

In the configurations illustrated in FIGS. 8d and 9b board assembly 715 is shown in an upward position relative to connector edge centerline 707. In this instance, connectivity between upper board contact 714A and upper contact member 708A is facilitated by a conductive element 906, while connectivity between lower board contact 714B and lower contact members 708B is facilitated by conductive elements 908.

Figure 9C:
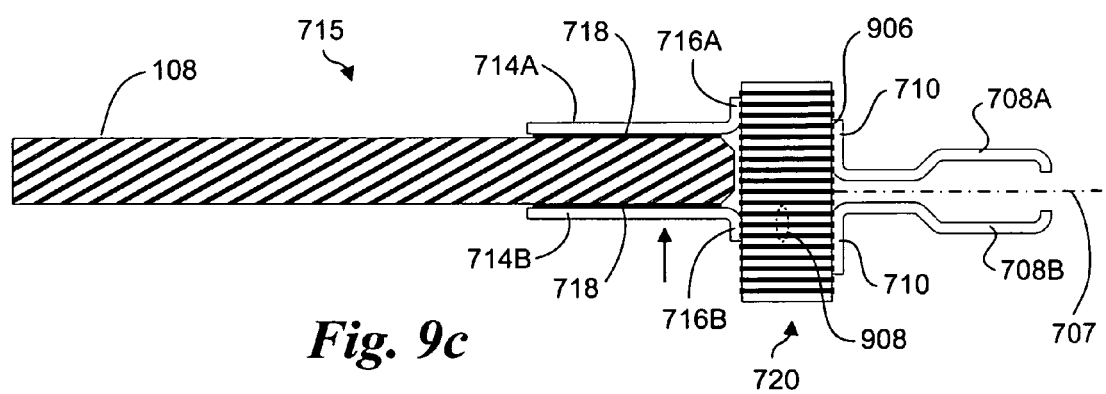

As depicted by FIGS. 9b and 9c, elastomer connector 720 provides sufficient connectivity between respective board contacts 714 and contact members 708, regardless of the vertical position of the board assembly 715. Thus, adjustable edge connector adaptor 700 provides adjustability in the vertical direction.

Figure 10A:
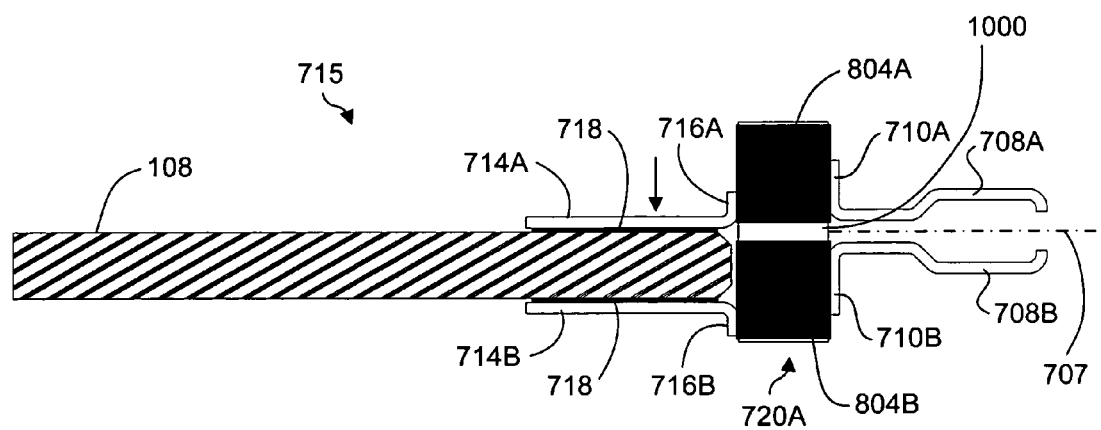
FIG. 10a shows a partial cross section view illustrating selective elements corresponding to the upward board assembly position of FIG. 8c when using a pair of elastomer connectors of the type shown in FIG. 8b.
Figure 10B:
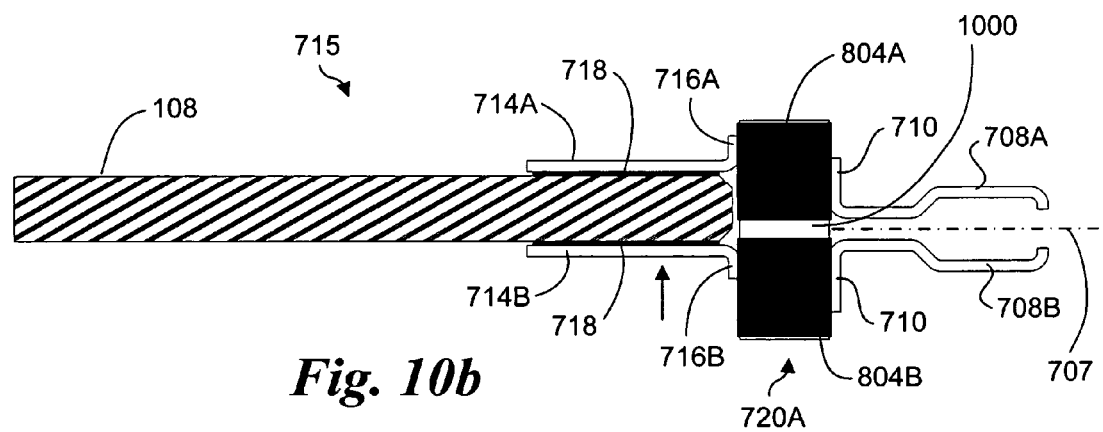
FIG. 10b shows a partial cross section view illustrating selective elements corresponding to the downward board assembly position of FIG. 8d when using a pair of elastomer connectors of the type shown in FIG. 8b.

FIGS. 10a and 10b respectively show downward and upward board assembly 715 positions corresponding to an embodiment that employs an elastomer conductor 720A having alternating conductive layers 804 and non-conductive elastomer layers 806. As shown in FIG. 8b, the alternating conductive layers 804 and non-conductive elastomer layers 806 are disposed vertically. Accordingly, an upward or downward movement of the board assembly will result in the legs 716 of the board contacts 714 being electrically-coupled somewhere along the edge of a respective conductive layer 804. If only a single-sided connection is required, a single "block" of material for elastomer connector 720A may be employed. However, if a double-sided connection is to be supported, such as shown in FIGS. 10a and 10b, it will be necessary to employ two "blocks" of elastomer connector material, separated by either a space or a non-conductive material 1000 (such as the elastomer used in the elastomer connector). The reason for this is that the upper and lower board contacts 714A and 716A need to be electrically isolated.

Another problem that has been identified by vendors of ATCA boards and AdvancedMC modules relates to misalignment of mechanical interfaces due to tolerance stack ups. For example, the tolerances for an AdvancedMC connector and mating edge connector are very tight. However, the tolerances for the mechanical support structure used to position and/or support an AdvancedMC module card are less so. Furthermore, due to mechanical tolerance stack up starting with an ATCA carrier board as a common member to which each of an AdvancedMC connector and support structure is mounted, there will be instances under which installation of an AdvancedMC module will created excess forces on the module card, edge connector interface, and/or support structure.

In accordance with further aspects of some embodiments, adjustable edge connector adaptor 700 also may be configured to provide adjustability in the horizontal direction to reduce forces resulting from assembly misalignments in the horizontal plane. For example, either of the elastomer connector material configurations illustrated by elastomer connectors 720 and 720A may support a horizontal offset of slightly less than one-half of the edge connector pitch (e.g., ~0.375 mm). This is in consideration that there is no flexing of the elastomer connector material. However, since the elastomer connector is primarily made of an elastomer material that can easily flex, even further adjustment in the horizontal direction may be obtained by some embodiments.

Figure 11A:
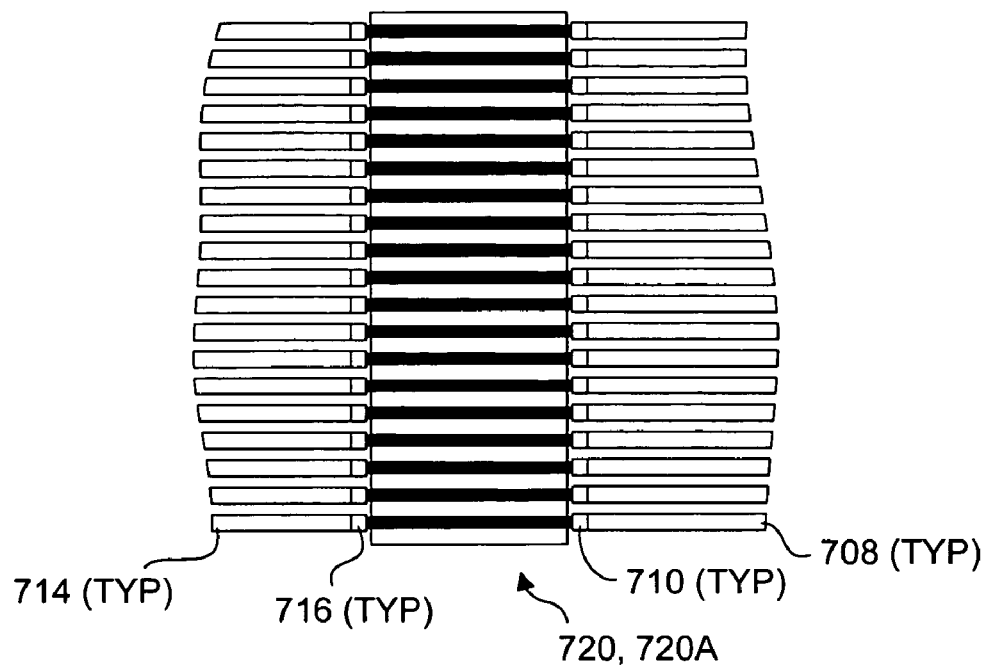
FIGS. 11a and 11b respectively show an original configuration of an elastomer connector and a flexed configuration of an elastomer connector that enables displacement in a horizontal direction between opposing surfaces of the elastomer connector.
Figure 11B:
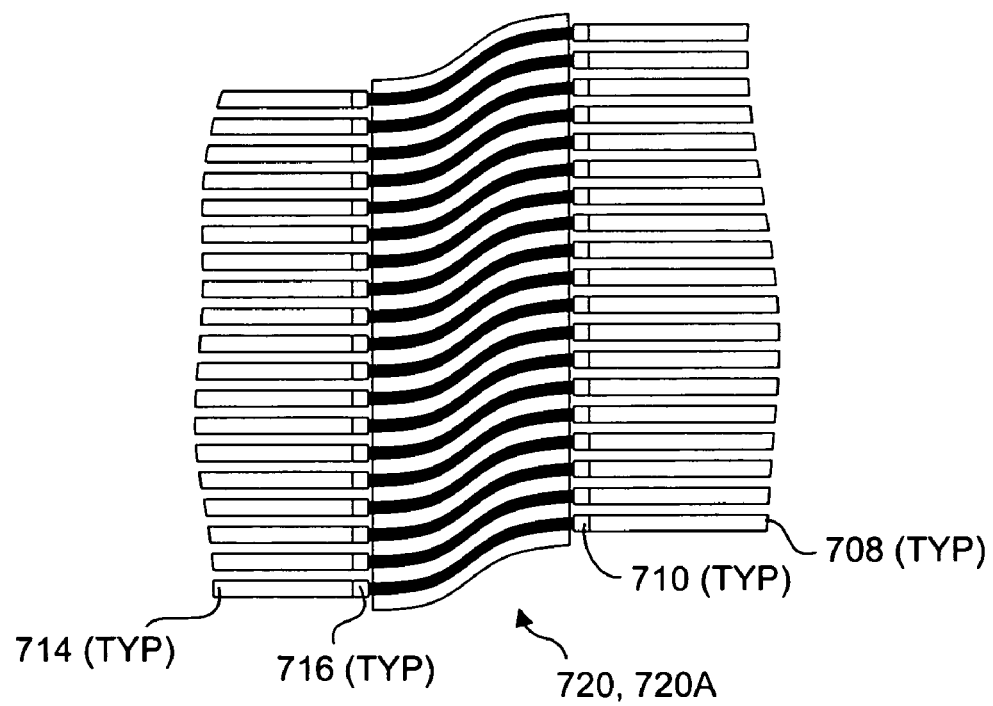

For example, FIGS. 11a and 11b respectively show plan views of a portion of elastomer connector 720 or 720A in an initial non-flexed configuration and in a flexed configuration. As the elastomer connector material flexes, the embedded conductive elements or alternating conductor layers flex with the surrounding elastomer. Thus, board contacts 714 are enabled to be displaced relative to contact members 708 in the horizontal direction. Accordingly, board assembly 715 is enabled to be adjusted relative to edge connector 705 in the horizontal direction.

In order to provide an adequate pressure at the interface between the board contact legs and the elastomer connector while enabling positioning of the board assembly 715 relative to edge connector 705, a two-dimensional sliding mechanism is provided. Returning to FIGS. 7a and 7b, in one embodiment this mechanism is facilitated by a slot and pin interface. In the embodiment illustrated in FIG. 7a, a pair of pins 750 are inserted into AdvancedMC module card 108. Meanwhile, slots 752 are formed in the top 754 and bottom 756 of housing 702. The pin/slot interface enables the position of board assembly 715 to move both vertically and horizontally relative to edge connector 705 while maintaining a sufficient pressure at the interface between board contact legs 716 and the surface of elastomer connector 720 to enable flexure of the elastomer connector without slippage in the horizontal direction.

In another embodiment (not illustrated), a pair of slots similar to slots 752 are formed in AdvancedMC module card 108. Meanwhile, a pair of pins are press-fit into corresponding holes in the top 754 and bottom 756 of housing 702 during installation of board assembly x into cavity 704.

Under some installations, it may be desired to secure board assembly 715 within cavity 704 of adjustable edge connector 700 once the height position of the board assembly relative to the ATCA carrier board 102 has been adjusted. There are several components that may be employed for this purpose that are well-known in the art. These generally include standoff, bosses, and other types of spaces. In the embodiment illustrated in FIGS. 7a and 7b, multiple spacer blocks 758 are employed. The spacer blocks "sandwich" AdvancedMC module card 108 between top 754 and bottom 756 of housing 702, maintaining the height of board assembly X. Meanwhile, the spacer blocks permit movement in the horizontal direction. In general, the spacer blocks may be unsecured or secured to either AdvancedMC module card 108 or top 754 and bottom 756 of housing 702. For example, spacer blocks 758 may be mounted on the top and bottom of AdvancedMC module card 108 using a suitable adhesive or the like, or make be secured to top 754 and bottom 756 using a suitable fastening means, such as a screw or adhesive.

In general, the edge connector adaptor embodiments described herein may be manufactured employing common techniques employed in the manufacture of highly reliable connectors. Typically, the connector housing (e.g., connector housing 702) will be formed from a plastic or other type of insulator. Meanwhile, the contact members will be formed from some type of resilient conductor, such as, but not limited to copper, aluminum, beryllium, and various allows. Furthermore, the contact members may be plated with a highly-conductive material, such as gold or silver. A casting and/or injection molding process may typically be used to manufacture the edge connector adaptor, although other techniques for forming components of this type may also be employed. In addition, post molding machine operations, such a stamping, milling, etc., may be used to form the final configuration.

In the context of the ATCA AdvancedMC module configurations shown in FIGS. 1-4, an edge connector adaptor in accordance with the teachings herein may be employed to couple the module card edge connector to a mating slot in an AdvancedMC connector of various types, including an B or AB style AdvancedMC connector for a single-sided edge connector, or a B+ or A+B+ style AdvancedMC connector for a double-sided edge connector. The edge connector adaptor may also be employed for the single-width board shown in FIG. 5a and the dual-width board shown in FIG. 5b.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

What is claimed is:

1. An apparatus comprising:
a housing, having a cavity formed in a first side;
an elastomer connector disposed in the cavity, the elastomer connector including elastomer material and conductive elements; and
an edge connector, including a connector edge extending outward from a second side of the housing opposite the first side and a first plurality of contact members arrayed across a first side of the connector edge, each contact member having a first end electrically coupled to at least one of the conductive elements on a first side of the elastomer connector and a second end disposed in or on the connector edge.

2. The apparatus of claim 1, wherein each of the first plurality of contact members includes a leg formed toward the first end, a surface of each leg being in contact with a vertical portion of the first side of the elastomer connector.

3. The apparatus of claim 1, wherein the edge connector comprises a double-sided edge connector further comprising:
a second plurality of contact members arrayed across a second side of the connector edge, each contact member having a first end electrically coupled to at least one conductive element on a first side of the elastomer connector and a second end disposed in or on the connector edge.

4. The apparatus of claim 1, wherein the edge connector has a form factor configured to mate with an Advanced Mezzanine Card (AdvancedMC) connector, and wherein, upon insertion of the edge connector into the AdvancedMC connector, a respective contact member is in contact with a respective contact in the AdvancedMC connector.

5. The apparatus of claim 1, wherein the elastomer connector comprises the elastomer material embedded with a plurality of the conductive elements passing through the elastomer material and configured in an array.

6. The apparatus of claim 1, wherein the elastomer material and the conductive elements are configured in layers.

7. The apparatus of claim 1, further comprising:
a board assembly including,
a circuit board having a connector edge; and
a plurality of board contacts electrically coupled to circuitry in the circuit board, a portion of each board contact being in contact with at least one conductive element on the second side of the elastomer connector,
wherein each board contact is electrically-coupled to a respective contact member on the edge connector via the elastomer connector, and the board assembly is enabled to be vertically adjusted relative to the edge connector while maintaining the electrical coupling between respective board contacts and contact members.

8. The apparatus of claim 7, at least one spacer to assist in maintaining a height position of the board assembly relative to the edge connector.

9. The apparatus of claim 7, wherein the circuit board comprises an AdvancedMC card.

10. The apparatus of claim 7, wherein each board contact is electrically-coupled to a respective contact member on the edge connector via the elastomer connector, and the apparatus enables the board assembly to be adjusted horizontally relative to the edge connector while maintaining the electrical coupling between respective board contacts and contact members.

11. The apparatus of claim 10, further comprising a mechanism to maintain a sufficient force between a face of the board contacts and the elastomer connector such that the first and second sides of the elastomer connector are caused to move horizontally relative to each other when the board assembly is moved relative to the edge connector.

12. The apparatus of claim 7, wherein a board contact includes a leg having a surface that is contact with the second side of the elastomer connector.

13. An edge connector adaptor, comprising:
a housing;
an edge connector coupled to the housing, including a connector edge having a first plurality of contact means arrayed across a first side of the connector edge;
means for electrically coupling each contact means on the edge connector with a respective contact on a circuit board while enabling a vertical position of the circuit board relative to the edge connector to be adjusted; and means for securing a vertical position of the circuit board relative to the edge connector; and means for securing the circuit board to the housing.

14. The edge connector adaptor of claim 13, wherein the means for electrically coupling each contact means on the edge connector with a respective contact on the circuit board further enables a horizontal position of the circuit board to be adjusted relative to the edge connector.

15. The edge connector adaptor of claim 13, wherein the edge connector is configured to mate with an Advanced Mezzanine Card (AdvancedMC) connector.

16. An apparatus, comprising:

an Advanced Mezzanine Card (AdvancedMC) edge connector adaptor, including,
  a housing, having a cavity formed in a first side;
  a elastomer connector, disposed in the cavity; and
  an edge connector, including a connector edge extending outward from a second side of the housing opposite the first side and a first plurality of contact members arrayed across a first side of the connector edge, each contact member having a first end including a leg that is electrically coupled to at least one conductive element on a first side of the elastomer connector and a second end disposed in the connector edge,
  wherein the edge connector is configured to mate with an AdvancedMC connector having a basic slot configuration.

17. The apparatus of claim 16, wherein the AdvancedMC edge connector adapter further includes:

a second plurality of contact members, arrayed across a width of the contact edge, each contact member in the second plurality of contact members including a leg that is electrically coupled to at least one conductive element on the first side of the elastomer connector and disposed opposite a respective contact member of the first plurality of contact members, wherein the edge connector is configured to mate with an AdvancedMC connector having an extended slot configuration.

18. The apparatus of claim 16, further comprising:

an AdvancedMC module card having an edge connector inserted into the recess of the housing and including a plurality of board contacts, each having a surface in contact with at least one conductive element on a second side of the elastomer connector, wherein, each board contact is electrically coupled to a respective contact member in the edge connector via the elastomer connector.

19. The apparatus of claim 18, wherein a leading portion of each board contact includes a vertically-disposed leg having a surface in contact with the at least one conductive element on the second side of the elastomer connector.

20. The apparatus of claim 18, wherein a horizontal and vertical position of the AdvancedMC module card is enabled to be adjusted relative to the edge connector while maintaining an electric coupling between each board contact and its respective contact member in the edge connector.

21. An apparatus, comprising:

An Advanced Mezzanine Card (AdvancedMC) edge connector adaptor, comprising:
  a housing, having a cavity formed in a first side;
  an elastomer connector including conductive elements and elastomer material, disposed in the cavity; and
  a first edge connector, including,
    a connector edge extending outward from a second side of the housing opposite the first side;
    a first plurality of contact members arrayed across a first side of the connector edge, each contact member having a first end including a leg that is electrically coupled to at least one of the conductive elements on a first side of the elastomer connector and a second end disposed in the connector edge;
    a second plurality of contact members arrayed across a second side of the connector edge, each contact member having a first end including a leg that is electrically coupled to at least one of the conductive elements on the first side of the elastomer connector and a second end disposed in the connector edge; and
  an AdvancedMC module card having a second edge connector inserted into the recess of the housing and including a plurality of board contacts disposed on opposing sides of the edge connector, each board contact having a surface in contact with at least one conductive element on a second side of the elastomer connector,
  wherein, each board contact is electrically coupled to a respective contact member in the first edge connector via the elastomer connector, and wherein the second edge connector is enabled to move relative to the first edge connector in both a horizontal and vertical direction while maintaining the electrical coupling between respective board contacts and contact members.

* * * * *